July 26, 1966 A. LOCHANKO 3,263,190
FREQUENCY MODULATED OSCILLATOR
Filed Nov. 19, 1963
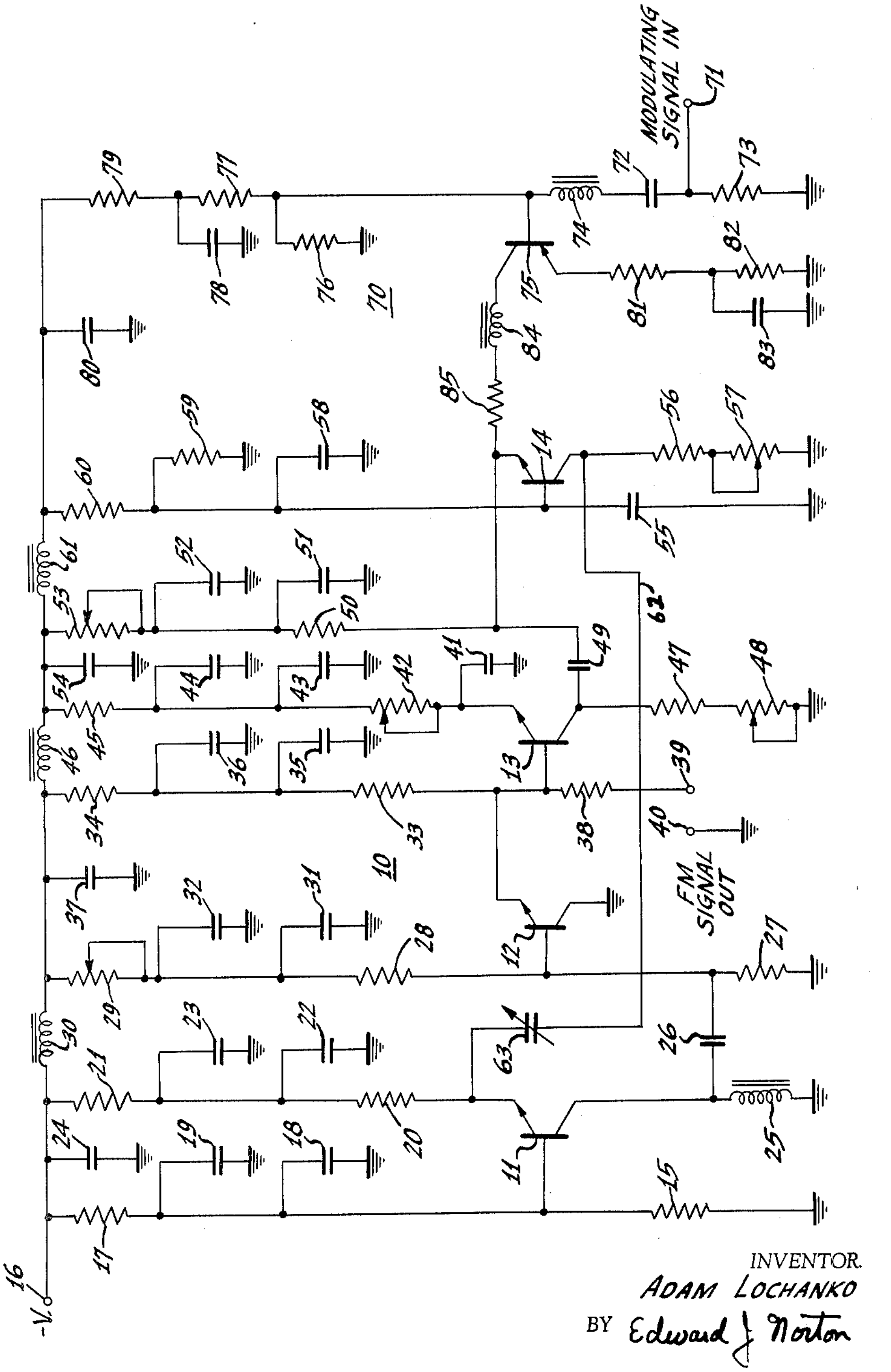
INVENTOR.
ADAM LOCHANKO
BY Edward J. Norton
Attorney 3,263,190

FREQUENCY MODULATED OSCILLATOR

Adam Lochanko, Cherry Hill, N.J., assignor to Radio Corporation of America, a corporation of Delaware Filed Nov. 19, 1963, Ser. No. 324,706
9 Claims. (Cl. 332—29)

This invention relates to oscillator circuits and, particularly, to an improved oscillator circuit which is varied in frequency under the control of an external signal.

It is an object of the invention to provide an improved frequency modulated oscillator.

Another object is to provide an improved frequency modulated oscillator of stable center frequency having a liear response to a wideband, modulating signal.

Briefly, in the embodiment described herein, an oscillator is provided including a plurality of silicon junction transistor devices of one type of conductivity arranged in a phase shift loop which has unity gain and a 360 degree phase shift at the desired frequency. The oscillator is deviated from its center frequency by the operation of a driver stage to which is applied a modulating signal, for example, a low frequency amplitude varying signal or a wideband, amplitude modulated input signal. The driver stage includes a germanium junction transistor device of the opposite type of conductivity coupled over a direct current path to one of the transistors in the phase shift loop so as to control the emitter current and, therefore, the base-emitter input impedance of that transistor. Variation of this impedance changes the phase shift of the loop, resulting in a change in the oscillator frequency in order to maintain the unity gain, 360 degree phase relationship. Because the change in the base-emitter input impedance of the modulated silicon transistor is mainly a change of resistance in the phase shift loop, an accurate linear relationship exists between the change in the frequency of the oscillator and the level of the received wideband, modulating input signal. A frequency modulated signal of stable center frequency is produced with very low amplitude and phase distortion.

A more detailed description of the invention will now be given in connection with the signal figure of the drawing which is a circuit diagram of one embodiment of a frequency modulated oscillator constructed according to the invention.

In describing the invention, reference will be made to a frequency modulated oscillator designed for operation at a center frequency of 70 mc. (megacycles). The oscillator can be designed for operation at any desired center frequency by the proper choice of values for the components used and other circuit parameters.

An oscillator is shown including a phase shift loop indicated generally as 10 consisting of four silicon, NPN junction (P type) transistors 11, 12, 13 and 14. Transistor 11 is connected in a common base configuration. The base electrode of transistor 11 is connected to a point of reference potential or ground through a resistor 15 and to the negative terminal 16 of a source of unidirectional potential, for example, at —24 v., through a resistor 17. A small capacitor 18 constructed of ceramic, for example, is connected between the base electrode of transistor 11 and ground. Capacitor 18 serves to ground the base electrode of transistor 11 for RF (radio frequency) energy at the center frequency of the oscillator. A larger capacitor 19 which can be an electroyltic capacitor, for example, is also connected between the base electrode of the transistor 11 and ground. The capacitor 19 functions with the resistor 17 as a low pass or decoupling filter, preventing the application of low frequency components from the source 16 and associated wiring to the base electrode of transistor 11.

The emitter electrode of the transistor 11 is connected to the terminal 16 through the resistors 20 and 21. A capacitor 22 provides an RF ground at the junction of resistors 20 and 21. A second capacitor 23 is connected between ground and the junction of the resistors 20 and 21. Capacitor 23 operates with resistor 21 to form a decoupling filter similar to resistor-capacitor filter 17, 19. An RF by-pass capacitor 24 is connected between ground and the junction of the resistors 17 and 21. The collector electrode of the transistor 11 is connected through a load inductance 25 to ground. The resistance values of the resistors 15, 17, 20, 21 and of the inductor 25 are determined to bias the transistor 11 for Class A operation. The inductance value of the inductor 25 is determined so that the inductance added to the capacitance of the transistor 11 serves to prevent the amplitude response of the transistor oscillator loop 10 from dropping off at the high end of the range of frequencies over which the loop 10 is operated.

The collector electrode of transistor 11 is coupled through a capacitor 26 to the base electrode of the next transistor 12. Transistor 12 is connected as an emitter follower in a common collector configuration with the collector electrode of transistor 12 being connected directly to ground. A resistor 27 is connected between the base electrode of the transistor 12 and ground. The base electrode of the transistor 12 is also connected to the terminal 16 over a path including a resistor 28, a variable resistor 29 and an RF choke 30. An RF by-pass capacitor 31 is connected between the junction of the resistors 28, 29 and ground. A further capacitor 32 connected between the junction of the resistors 28, 29 and ground forms a decoupling filter with the resistor 29. Transistor 12 is biased for Class A operation.

The emitter electrode of transistor 12 is connected over a direct current path to the base electrode of the next transistor 13. Transistor 13 is connected in a common emitter configuration. The base electrode of the transsistor 13 is connected to the terminal 16 over an electrical path including resistors 33, 34 and the RF choke 30. A capacitor 35 and a capacitor 36 are connected between ground and the junction of the resistors 33 and 34. Capacitor 35 serves to ground the junction of resistors 33 and 34 for RF energy. Capacitor 36 operates with the resistor 34 as a decoupling filter. An RF bypass capacitor 37 is connected to the junction of the RF chokes 30 and 46.

The base electrode of the transistor 13 is connected to an output terminal 39 of a pair of output terminals 39, 40 through a resistor 38. In this manner, the output signal is derived from a low impedance point in the phase shift loop 10 which is common to the transistors 12 and 13. The emitter electrode of the transistor 13 is connected to the terminal 16 over an electrical path including a variable resistor 42, a resistor 45, an RF choke 46, and the RF choke 30. Capacitor 41 connected between the emitter of transistor 13 and ground is an RF by-pass capacitor and is valued so as to provide with the variable resistor 42 a control for determining the phase shift introduced in the phase shift loop 10 by the transistor stage 13 and, therefore, the linearity of the phase shift loop 10. Capacitor 43 connected between the junction of resistors 42 and 45 and ground, grounds the juncture of resistors 42 and 45 for RF energy. Capacitor 44 also connected between the junction of resistors 42 and 45 and ground operates with the resistor 45 as a decoupling filter. The collector electrode of the transistor 13 is connected to ground through a resistor 47 and a variable resistor 48. Transistor 13 is biased for Class A operation.

The collector electrode of the transistor 13 is also coupled through a capacitor 49 to the emitter electrode of the next transistor 14. Transistor 14 is connected in a common base configuration. The emitter electrode of the transistor 14 is connected to the terminal 16 over an electrical path including a resistor 50, a variable resistor 53, and the RF chokes 30 and 46. Capacitor 51 connected between the junction of resistors 50 and 53 and ground, grounds the junction of resistors 50 and 53 for RF energy at the center frequency of the oscillator, and capacitor 52 connected between the junction of resistors 50 and 53 and ground forms a decoupling filter with the resistor 53. RF by-pass capacitor 54 is connected between the junction of resistor 53 and RF choke 46 and ground.

The base electrode of the transistor 14 is connected to the terminal 16 over an electrical path including a resistor 60, an RF choke 61, and the RF chokes 46 and 30. Resistor 59 connected between the junction of the base of transistor 14 and resistor 60 and ground functions as a voltage divider to apply the proper bias voltage to the base electrode of the transistor 14. A low-frequency by-pass capacitor 55 is connected between the base of transistor 14 and ground. An RF by-pass capacitor 58 is also connected between the base of transistor 14 and ground. The collector electrode of the transistor 14 is connected to ground through a resistor 56 and a variable resistor 57. Transistor 14 is biased for Class A operation. In order to complete the phase shift loop, the collector electrode of the transistor 14 is connected to the emitter electrode of the transistor 11 over an electrical path including a lead 62 and a variable capacitor 63.

An oscillating loop is thus provided including four transistor stages 11, 12, 13 and 14. A 360 degree loop phase shift is created with the loop oscillating at a frequency which corresponds to this phase shift. Each transistor stage 11, 12, 13 and 14 with associated circuitry contributes a portion of the total phase shift about the loop 10. The amount of phase shift contributed by each of the transistor stages 11, 12, 13, 14 is determined by selecting appropriate values for the associated circuit components to bias the transistor for current conduction at the proper level. The oscillating frequency or center frequency of the loop 10 is determined largely by the capacitors 26, 49, 63 and the input and output impedances of the transistors 11, 12, 13 and 14.

A driver stage indicated generally as 70 functions to modulate the frequency of the phase shift loop oscillator 10 according to a wideband modulating signal received at an input terminal 71. The input terminal 71 is connected to one side of a blocking capacitor 72 and to one end of a resistor 73. The other end of the resistor 73 is connected to ground. The other side of the capacitor 72 is connected through an RF choke 74 to the base electrode of a germanium PNP (N type) junction transistor 75. The base electrode of the transistor 75 is also connected to the terminal 16 over an electrical path including a resistor 77, a resistor 79, and the RF chokes 61, 46, and 30. Resistor 76 connected between the junction of the base of transistor 75 and resistor 77 and ground, resistor 77, and resistor 79 form a voltage dividing network for determining the bias voltage applied to the base electrode of transistor 75. Capacitor 78 connected between the junction of resistors 77 and 79 and ground forms with the resistor 79 a decoupling filter. An RF by-pass capacitor 80 is connected between the junction of resistor 79 and RF choke 61 and ground.

The emitter electrode of transistor 75 is connected to ground through resistors 81 and 82. A by-pass capacitor 83 is connected between the junction of resistors 81, 82 and ground. It is noted that a portion of the emitter resistance of the transistor 75 is unbypassed to provide suitable negative feedback for the operation of transistor 75. The collector electrode of the transistor 75 is connected to the emitter electrode of the transistor 14 over a direct current path including an RF choke 84 and a resistor 85. The RF choke 84 is valued to block the oscillating frequency of the phase shift loop 10 from the driver state 70, while passing the modulating signal from the driver stage 70 to the emitter electrode of the transistor 14. Transistor 75 is biased for Class A operation. Resistor 85 and the emitter-to-base input impedance of the transistor 14 form loading for the collector of transistor 75 at the modulating frequency.

The RF chokes 30, 46, 61 and the capacitors 24, 37, 54, 80 form decoupling networks, preventing the coupling of stray RF energy at the center frequency of the oscillator between the transistor stages 11, 12, 13, 14 and 75. The RF chokes 30, 46, 61 are preferably in the form of ferrite coils having high RF resistance. The RF by-pass capacitors 18, 22, 24, 31, 37, 35, 43, 51, 54, 58 and 80 can be of the same size and construction as each other, and the filter capacitors 19, 23, 32, 36, 44, 52 and 78 can be of the same size and construction as each other.

In the operation of the invention, power is applied to the terminal 16. The phase shift loop 10 oscillates at the center frequency determined by the 360 degree loop phase shift and for example assumed to be 70 mc. A modulating signal is applied to the input terminal 71. The modulating signal can take the form of a sine wave, a square wave or any other complex waveform. By way of example, it will be assumed that an amplitude modulated input signal having a bandwidth up to 4 mc. or more is applied to the input terminal 71.

Transistor 14 draws current through the resistors 53 and 50, while transistor 75 draws current through the resistors 53, 50 and 85. Since the current drawn by the transistor 75 is a function of the level of the modulating signal applied thereto from input terminal 71, the emitter current and therefore the base-emitter impedance of transistor 14 also becomes a function of the level of the received modulating signal. Variation of this impedance changes the phase shift contributed by the transistor stage 14, producing a corresponding change in the phase shift of the loop 10. The oscillating frequency must change to maintain the unity gain, 360 degree phase relationship. Transistor 14 is, in effect, a phase modulator. Variation of the phase shift introduced by the transistor 14 in the oscillating energy with the emitter injected modulating signal causes a corresponding change in the frequency of the loop oscillation to restore the 360 degree feedback voltage relationship.

The controlled base-emitter input impedance of the silicon transistor 14 is mainly resistive. By connecting the collector electrode of the germanium transistor 75 and the emitter electrode of transistor 14 to a common D.C. point, this resistance is varied directly with the received modulating signal in a direction dependent upon the change in the level of the received modulating signal. As the level of the modulating signal goes more positive, for example, the collector current of transistor 75 becomes smaller. The emitter current of transistor 14 becomes smaller and transistor 14 conducts less heavily, increasing the resistance (and phase shift) presented by the transistor 14 in the loop 10. A corresponding increase in the oscillating frequency occurs. Upon a decrease in the level of the received modulating signal, the collector current of the transistor 75 and the emitter current of transistor 14 become larger. Transistor 14 conducts more heavily, reducing the resistance (and phase shift) introduced by the transistor 14 in the loop 10. A corresponding decrease in the oscillating frequency occurs.

Transistor 14 is biased so that, with the emitter injection of the modulating signal, the transistor 14 operates over a linear portion of its characteristic curve for the entire variation in the base-emitter impedance with the wideband, received modulating signal. Since the change in the resistance represented by the transistor 14 in the loop can be made quite linear with variations in the received modulating signal, an almost perfect linear relationship between the frequency excursion of the oscillator and the level of the impressed modulating voltage results, yielding a frequency modulated carrier signal with very low phase and amplitude distortion. A frequency modulated signal of 70 mc. ±4 mc. appears at the output terminals 39, 40 for application to an utilization circuit.

Variable resistors 29, 48, 42, 57 and 53 provide tuning adjustment for the frequency modulated oscillator. Resistor 53 connected in the emitter circuit of transistor 14 largely effects the center frequency of the oscillator and can be valued so as to tune the center frequency approximately ±1 mc. The resistors 29, 48, 42, 57 and capacitor 63 can be varied to tune for maximum linearity and minimum group delay, as well as the desired center frequency.

In a frequency modulated oscillator constructed in the manner of the circuit diagram shown in the drawing, the silicon transistors 11, 12, 13, 14 were of a type identified at 2N834. The germanium transistor 75 was of a type identified as 2N2360. The following values were used.

| | | |
|---|---|---|
| Capacitors **18, 22, 31, 35, 43, 51, 58, 24, 37, 54, 80** | micromicrofarads | 470 |
| Capacitors **19, 23, 32, 36, 44, 52, 78** | microfarads | 47 |
| Capacitors **26, 49** | micromicrofarads | 10 |
| Capacitor **63** | do | 3–15 |
| Capacitor **55** | microfarads | 82 |
| Capacitor **41** | micromicrofarads | 68 |
| Capacitors **72, 83** | microfarads | 220 |
| Resistor **15** | ohms | 2200 |
| Resistor **17** | do | 3300 |
| Resistor **20** | do | 3900 |
| Resistors **21, 38** | do | 1000 |
| Resistors **27, 59** | do | 1500 |
| Resistors **28, 56** | do | 1.5K |
| Resistors **29, 57** | do | 500 |
| Resistor **33** | do | 560 |
| Resistor **34** | do | 390 |
| Resistors **42, 48, 53** | do | 200 |
| Resistor **45** | do | 750 |
| Resistor **47** | do | 22 |
| Resistors **50, 82** | do | 910 |
| Resistor **60** | do | 1300 |
| Resistor **73** | do | 78.7 |
| Resistor **76** | do | 2700 |
| Resistor **77** | do | 12K |
| Resistor **79** | do | 6800 |
| Resistor **81** | do | 150 |
| Resistor **85** | do | 680 |
| Inductor **25** | microhenries | 0.33 |
| RF chokes **74, 84** | do | 5.6 |

A frequency modulated signal having a frequency of 70 mc. ±4 mc. was produced. The frequency modulated oscillator exhibited a center frequency stability over a temperature range of −20 to +70 degrees centigrade within ±1 mc. Group delay was approximately 1.5 nanoseconds over ±4 mc., and the linearity was within a fraction of one percent.

Temperature stabilization is provided by using the direct coupled, complementary arrangement of transistors 14 and 75. Any change in the performance of the silicon transistors 11, 12, 13 and 14 due to a change in the operating temperature is reflected as a change of the loop 10 center frequency. For the same change in operating temperature, a change in the collector current drawn by the germanium transistor 75 takes place. By matching the transistors 14, 75 according to their respective performance curves with change in temperature, it is possible to minimize any drift in the center frequency of the loop 10 with variations in temperature.

By way of example, an increase in the temperature causes the loop 10 center frequency to become higher. At the same time, the transistor 75 draws more current through the resistors 50 and 53 which are common to the transistor stages 14 and 75. The voltage at the emitter electrode of the transistor 14 becomes less negative and, hence, the center frequency of the loop 10 decreases. This decrease in the center frequency compensates for the increase in the center frequency with increase in temperature. Once the amount of drift of the loop 10 center frequency with variation in temperature is known, the transistor 75 with associated components can be chosen to produce the proper amount of D.C. voltage variation at the emitter electrode of the transistor 14 to tend to bring the center frequency of the loop 10 back to its nominal value.

In applications where greater temperature stabilization is desired, the frequency modulated oscillator can be mounted within an insulated temeprature controlled compartment such as an oven. The oven is regulated to provide a constant operating temperature. By way of example, a frequency modulated oscillator constructed in the manner shown in the circuit diagram of the drawing with the component values listed above and mounted in a thermostatically controlled oven designed to maintain the operating temperature at substantially +55 degrees centigrade exhibited a center frequency of 70 mc. within 200 kc. (kilocycles) over an external temperature range of −20 to +70 degrees centigrade; and within 50 kc. over an external temperature range of −20 to +55 degrees centigrade.

What is claimed is:

1. A frequency modulated oscillator comprising, in combination,
   a transistor device having base, emitter and collector electrodes,
   means connected to said electrodes to form a phase shift loop which has unity gain and a 360 degree phase shift at a given frequency, said transistor's base to emitter impedance contributing a portion of said 360 degree phase shift,
   and means to vary said frequency by controlling the base-to-emitter impedance of said device to change said portion of phase shift in accordance with said base-to-emitter impedance change.

2. A frequency modulated oscillator comprising, in combination,
   a junction transistor having base, emitter and collector electrodes,
   means connected to said electrodes to form a phase shift loop oscillator in which said transistor is connected with an emitter input and a collector output, in such a manner as to contribute a portion of said phase shift,
   and means for determining the oscillating frequency of said loop oscillator by controlling the emitter current of said transistor to cause said portion of phase shift to vary in accordance with said change in emitter current.

3. A frequency modulated oscillator comprising, in combination,
   a first transistor having base, emitter and collector electrodes,
   means forming a phase shift loop in which said first transistor is connected with an emitter input and a collector output, whereby said first transistor contributes a portion of said phase shift due to its base to emitter impedance,
   a second transistor connected in a common emitter circuit arrangement and having an input and an output,
   means connecting said output of said second transistor to said emitter electrode of said first transistor,
   and means for applying a modulating signal to said input of said second transistor in a manner to cause said second transistor to control the emitter-to-base impedance of said first transistor over said connecting means according to said modulating signal.

4. A frequency modulated oscillator comprising, in combination, a first transistor of one type of conductivity and having base, emitter and collector electrodes,
means forming a phase shift loop in which said first transistor is connected with an emitter input and a collector output,
a second transistor of the opposite type of conductivity having base, emitter and collector electrodes connected in a common emitter circuit arrangement,
means connecting said collector electrode of said second transistor over a direct current path to said emitter electrode of said first transistor with said collector electrode of said second transistor and said emitter electrode of said first transistor being connected to a common point of direct current potential,
and means for operating said second transistor in response to a modulating signal applied to said base electrode of said second transistor to control over said connecting means the emitter current drawn by said first transistor from said point in accordance with said modulating signal.

5. A frequency modulated oscillator as claimed in claim 4 and wherein;
said first transistor is a silicon, NPN junction transistor and said second transistor is a germanium, PNP junction transistor.

6. In combination,
first, second, third and fourth transistors each having base, emitter and collector electrodes,
means interconnecting the electrodes of said transistors to form a phase shift loop oscillator having unity gain and a 360 degree phase shift at a given frequency,
at least one of said transistors being connected in said loop with an emitter input and a collector output,
and means connected to said emitter electrode of said one transistor for changing said frequency by controlling the base-to-emitter impedance of said one transistor.

7. In combination,
a first transistor connected in a common base circuit arrangement and having an emitter input and a collector output,
a second transistor connected in a common collector circuit arrangement and having a base input and an emitter output,
a third transistor connected in a common emitter circuit arrangement and having a base input and a collector output,
a fourth transistor connected in a common base circuit arrangement and having an emitter input and a collector output,
first means connecting said collector output of said first transistor to said base input of said second transistor over an alternating current path,
second means directly connecting said emitter output of said second transistor to said base input of said third transistor over a direct current path,
third means connecting said collector output of said third transistor to said emitter input of said fourth transistor over an alternating current path,
fourth means connecting said collector output of said fourth transistor to said emitter input of said first transistor over an alternating current path,
said first, second, third and fourth connecting means operating to complete a phase shift loop oscillator including said first, second, third and fourth transistors having unity gain and a 360 degree phase shift at a given frequency,
a fifth transistor connected in a common emitter circuit arrangement and having a base input and a collector output,
fifth means connecting said collector output of said fifth transistor to said emitter input of said fourth transistor over a direct current path with the collector of said fifth transistor and the emitter of said fourth transistor being connected to a common point of direct current potential,
means for applying an amplitude modulated input signal to said base input of said fifth transistor,
said fifth transistor operating in response to said signal to control by said fifth connecting means the emitter current drawn by said fourth transistor from said point and thereby to alter said frequency according to said signal,
and means for deriving the resulting frequency modulated signal from a low impedance point included in said direct current path between said emitter output of said second transistor and said base input of said third transistor.

8. A combination as claimed in claim 7, and wherein:
said first, second, third and fourth transistors are silicon NPN junction transistors and said fifth transistor is a germanium PNP junction transistor with said fifth transistor being determined to provide by said fifth connecting means compensation for drift in said given frequency with variations in temperature.

9. A combination as claimed in claim 7, and wherein;
said connecting means includes means biasing said first, second, third, fourth and fifth transistors for Class A operation.

References Cited by the Examiner

UNITED STATES PATENTS

| | | | |
|---|---|---|---|
| 2,870,421 | 1/1959 | Goodrich | 332—16 X |
| 2,974,294 | 3/1961 | Ravenscroft | 332—16 |

References Cited by the Applicant

UNITED STATES PATENTS

| | | |
|---|---|---|
| 2,771,584 | 11/1956 | Thomas. |
| 2,917,718 | 12/1959 | Wilson. |
| 2,951,955 | 9/1960 | Rosier, et al. |

NATHAN KAUFMAN, *Acting Primary Examiner.*

A. L. BRODY, *Assistant Examiner.*